(12) United States Patent
Kim et al.

(10) Patent No.: US 7,034,572 B2
(45) Date of Patent: Apr. 25, 2006

(54) VOLTAGE LEVEL SHIFTING CIRCUIT AND METHOD

(75) Inventors: Tae H. Kim, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 10/868,468

(22) Filed: Jun. 14, 2004

(65) Prior Publication Data

US 2005/0275430 A1    Dec. 15, 2005

(51) Int. Cl.
*H03K 19/094* (2006.01)
*H03K 19/0175* (2006.01)

(52) U.S. Cl. ......................................................... 326/68
(58) Field of Classification Search .................. 326/68, 326/80, 81
See application file for complete search history.

(56) References Cited

U.S. PATENT DOCUMENTS

| | | | |
|---|---|---|---|
| 4,978,870 A | 12/1990 | Chen et al. ................. 307/475 |
| 4,980,583 A | 12/1990 | Dietz ......................... 307/475 |
| 5,113,097 A | 5/1992 | Lee ............................ 307/475 |
| 5,680,064 A | 10/1997 | Masaki et al. ................ 326/81 |
| 5,739,700 A | 4/1998 | Martin ......................... 326/80 |
| 5,781,026 A | 7/1998 | Chow ........................... 326/26 |
| 5,905,618 A | 5/1999 | Cases et al. .................. 361/88 |
| 6,384,631 B1 | 5/2002 | Wert et al. ..................... 326/68 |
| 6,414,534 B1 | 7/2002 | Wang et al. ................. 327/333 |
| 6,501,306 B1 | 12/2002 | Kim et al. ................... 327/112 |
| 6,535,018 B1 | 3/2003 | Kost ............................ 326/68 |
| 6,566,932 B1 | 5/2003 | Yoon ........................... 327/333 |
| 6,567,067 B1 | 5/2003 | Azami ........................ 345/100 |
| 6,700,407 B1 | 3/2004 | Wert ............................ 326/81 |
| 6,731,273 B1 | 5/2004 | Koyama et al. ............. 345/204 |
| 6,774,696 B1 | 8/2004 | Clark et al. .................. 327/333 |
| 6,842,043 B1 * | 1/2005 | Nguyen et al. ................ 326/68 |
| 2003/0001628 A1 * | 1/2003 | Hsu et al. .................... 327/103 |

* cited by examiner

*Primary Examiner*—Peguy JeanPierre
(74) *Attorney, Agent, or Firm*—Dorsey & Whitney LLP (57) ABSTRACT

A voltage level shifting circuit and method that can be used for shifting the voltage level of an input signal to provide an output signal having a higher output voltage level. The voltage level shifting circuit includes pull-up transistors that are switched OFF by the voltage of a pair of switching nodes and not the voltage at the output node. The speed at which the pull-up transistors can be switched OFF is decoupled to some extent from the speed at which the voltage at the output node changes. Additionally, having the output node separated from the nodes that switch the pull-up transistors OFF further allows for dimensions of the various transistors of the voltage level shifting circuit to be scaled advantageously.

31 Claims, 4 Drawing Sheets

VOLTAGE LEVEL SHIFTING CIRCUIT AND METHOD

TECHNICAL FIELD

The present invention relates to voltage level shifting circuits, and more particularly, to a voltage level shifting circuit and method that can be used for shifting the voltage level of an input signal to provide an output signal having a higher output voltage level where the difference between the voltage levels of the input and output signals is large.

BACKGROUND OF THE INVENTION

Figure 1:
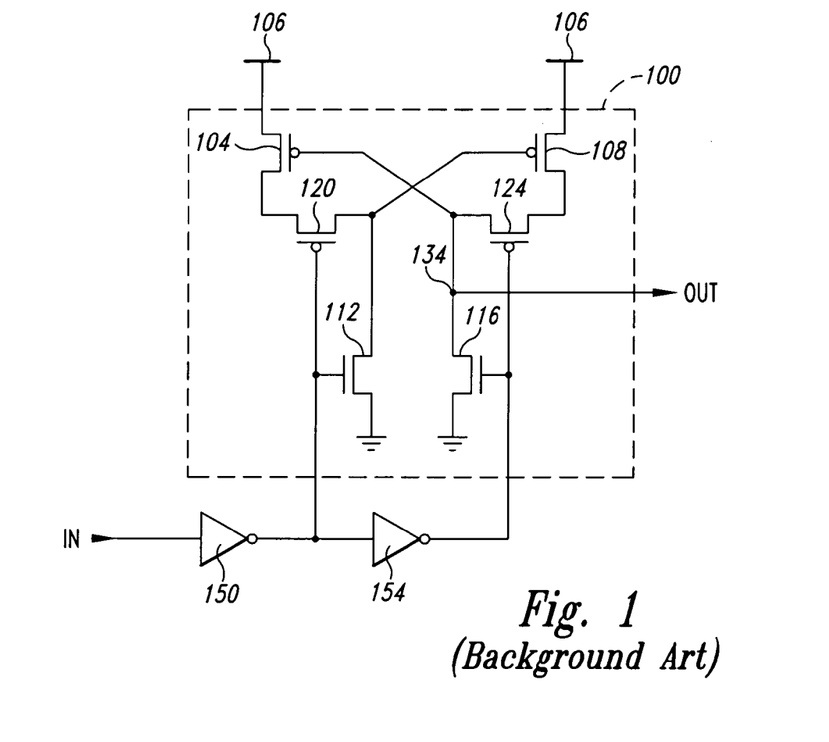
FIG. 1 is a schematic drawing of a conventional voltage level shifting circuit.

FIG. 1 illustrates a conventional voltage level shifting circuit 100 for translating an input signal IN having an input voltage level V1 to an output signal OUT having an output voltage level V2. The voltage level shifting circuit 100 includes p-channel MOS (PMOS) pull-up transistors 104 and 108 coupled to a voltage supply providing the voltage level V2. Coupled to the PMOS pull-up transistors 104, 108 are PMOS load transistors 120, 124 and n-channel MOS (NMOS) pull-down transistors 112, 116, all respectively. Gates of the PMOS load transistors 120, 124 and of the NMOS pull-down transistors 112, 116 are coupled to receive the IN signal having the V1 voltage level through series coupled inverters 150, 154. The OUT signal having the V2 voltage level is provided at an output node 134.

In operation, a falling edge of the IN signal causes the NMOS pull-down transistor 112 and the PMOS load transistor 124 to switch ON, and the NMOS pull-down transistor 116 and the PMOS load transistor 120 to switch OFF. In this state, the gate of the PMOS pull-up transistor 108 is coupled to ground, switching ON the PMOS pull-up transistor 108. With both the PMOS pull-up transistor 108 and the PMOS load transistor 124 switched ON, the output node is coupled to the V2 voltage supply. In response to a rising edge of the IN signal, the PMOS load transistor 120 and the NMOS pull-down transistor 116 are switched ON, and the PMOS load transistor 124 and the NMOS pull-down transistor 112 are switched OFF. As a result, the output node 134 is coupled to ground through the NMOS pull-down transistor 116. As the voltage of the output node 134 is pulled to ground, the PMOS pull-up transistor 104 eventually switches ON to couple the gate of the PMOS pull-up transistor 108 to the V2 voltage supply 106, thereby switching OFF the PMOS pull-up transistor 108 and decoupling the output node 134 from the V2 voltage supply 106. When the output node 134 is decoupled from the V2 voltage supply 106, the voltage of the output node 134 is finally pulled to ground.

The performance of the conventional voltage level shifting circuit 100 begins to suffer as the voltage difference between the input and output signals becomes greater. That is, the voltage difference between the input and output signals affects the speed at which the PMOS pull-up transistors 104, 108 and PMOS load transistors 120, 124 switch OFF, which in turn, specifically with respect to the PMOS pull-up transistor 108 and the PMOS load transistor 124, directly affects the speed at which the voltage at the output node 134 can be pulled to ground.

As previously described, a rising edge of the IN signal causes the NMOS pull-down transistor 116 to switch ON, thereby coupling the output node 134 to ground. However, at this time, the PMOS pull-up transistor 108 and the PMOS load transistor 124 are still ON because the threshold voltages for both transistors are still exceeded. With a large voltage difference between the V2 voltage level and the V1 voltage level, a large voltage swing must occur before the voltage at the gates of the PMOS pull-transistor 108 and the PMOS load transistor 124 relative to the voltage at the sources of the two transistors will decrease below the respective threshold voltages to switch the transistors OFF. Before the PMOS pull-up transistor 108 and the PMOS load transistor 124 are switched OFF, it is difficult for the NMOS pull-down transistor 116 to pull the output node LOW and because current is sunk through the NMOS pull-down transistor 116 to ground, power consumption is high. Finally, when the voltage of the output node 134 decreases enough so that the threshold voltage of the PMOS pull-up transistor 104 is exceeded, switching OFF the PMOS pull-up transistor 108 is accelerated due to the coupling of its gate to the V2 voltage supply. Although the PMOS load transistors 120 and 124 can be used to mitigate the problem by having device dimensions that can lower the voltage at the output node 134, as well as limit the current consumption, the current drive capability of the voltage level shifting circuit 100 is compromised as a result.

SUMMARY OF THE INVENTION

The present invention is directed to a voltage level shifting circuit and method for shifting the voltage level of an input signal and provide an output signal having a higher output voltage level. In one aspect of the invention, the voltage level shifting circuit includes a first current path from a voltage supply to ground having a first input signal node to which an input signal is coupled, a first output signal node from which an output signal is provided, a first pull-up node, and a first switching node. The first discharge path couples the voltage supply to the first output signal node under control of the first pull-up node and couples the switching node to ground in response to the input signal. The voltage level shifting circuit further includes a second current path from the voltage supply to ground having a second input signal node to which a complementary input signal is coupled, a second output signal node from which a complementary output signal provided, a second pull-up node coupled to the first switching node, and a second switching node coupled to the first pull-up node. The second discharge path couples the voltage supply to the second output signal node under control of the second pull-up node and couples the second switching node to ground in response to the complementary input signal. A third current path is included in the voltage level shifting circuit to couple the output signal node to ground in response to the input signal.

In another aspect of the present invention, a voltage level of an input signal is shifted to an output voltage level by coupling an output node to a voltage supply providing the output voltage level in response to an input signal having a first voltage level in order to provide an output signal having the output voltage level. Additionally, a first switching node is coupled to ground in response to the input signal having a second voltage level and a second switching node is coupled to the voltage supply in response to the first switching node coupled to ground. The output node is further coupled to ground in response to the input signal having a second voltage level, and the first switching node is decoupled from the output node in response to the input signal having a second voltage level.

DETAILED DESCRIPTION OF PREFERRED EMBODIMENTS

Embodiments of the present invention are directed to voltage level shifting circuits and methods that can be used for shifting the voltage level of an input signal to provide an output signal having a higher output voltage level where the difference between the voltage levels of the input and output signals is large. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
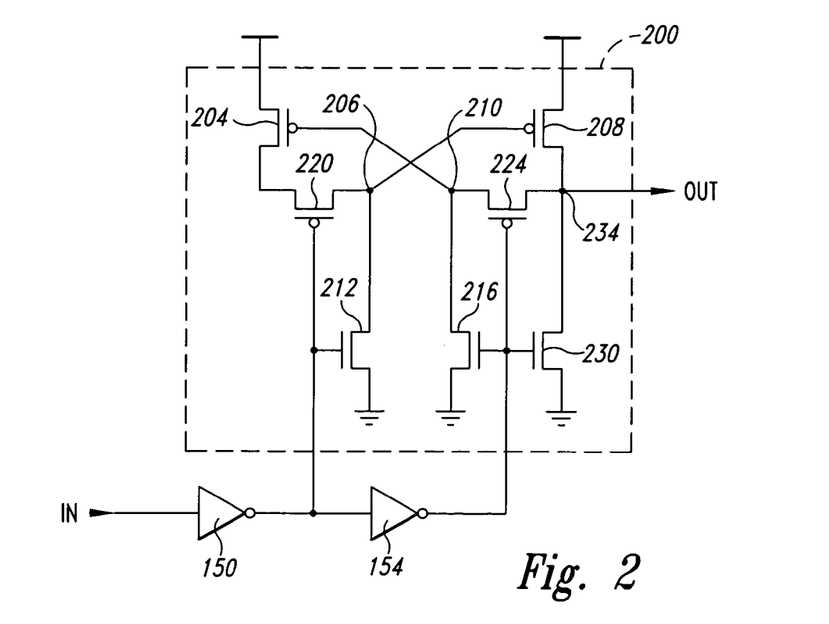
FIG. 2 is a schematic drawing of a voltage level shifting circuit according to an embodiment of the present invention.

FIG. 2 illustrates a voltage level shifting circuit 200 according to an embodiment of the present invention. The voltage level shifting circuit 200 translates an input signal IN having an input voltage level V1 to an output signal OUT having an output voltage level V2. The voltage level shifting circuit 200 includes pull-up transistors 204 and 208 coupled to a voltage supply providing the V2 voltage. The gates of the pull-up transistors 204 and 208 are coupled to switching nodes 210 and 206, respectively. The switching nodes can be coupled to ground through switching transistors 212, 216. Coupling transistors 220 and 224 are coupled between the pull-up transistors 204 and 208 and the switching nodes 206 and 210, all respectively. The IN signal is provided to the voltage level shifting circuit 200 through series coupled inverters 150 and 154. More specifically, the gates of the coupling transistor 220 and the switching transistor 212 are coupled to the output of the inverter 150 to receive an inverted IN signal, and the gates of the coupling transistor 224 and the switching transistor 216 are coupled to the output of the inverter 154 to receive a twice inverted IN signal (i.e., inverted once through the inverter 150 and inverted again through the inverter 154). The voltage level shifting circuit 200 further includes discharge transistor 230 coupled to an output node 234 and ground. The OUT signal is provided from the output node 234. The gate of the discharge transistor 230 is coupled to the output of the inverter 154. As will be discussed in more detail below, the discharge transistor 230 assists in pulling the voltage of the output node 234 to ground to increase responsiveness of the voltage level shifting circuit 200.

In operation, a falling edge of the IN signal is inverted by the inverter 150 to a rising edge signal that switches OFF the coupling transistor 220 and switches ON the switching transistor 212. The rising edge signal output by the inverter 150 is inverted by the inverter 154 into a falling edge signal that switches OFF the switching transistor 216 and switches ON the coupling transistor 224. The falling edge signal output by the inverter 154 also switches OFF the discharging transistor 230 to decouple the output node 234 from ground. In this state, the switching node 206 is coupled to ground through the switching transistor 212 to switch ON the pull-up transistor 208 and couple the output node 234 to the voltage supply providing the V2 voltage. As a result, a falling edge IN signal provides a rising edge OUT signal having a V2 voltage level. With the gate of the coupling transistor 224 receiving the falling edge signal from the inverter 154, the coupling of the output node 234 to the voltage supply eventually switches ON the coupling transistor 224 to couple the V2 voltage level to the gate of the pull-up transistor 204. In response, the pull-up transistor 204 is switched OFF.

At a rising edge of the IN signal, the IN signal is inverted by the inverter 150 to a falling edge signal, thereby switching OFF the switching transistor 212 and switching ON the coupling transistors 220. The falling edge signal output by the inverter 150 is inverted by the inverter 154 to a rising edge signal that switches OFF the coupling transistor 224 and switches ON the switching transistor 216 and the discharge transistor 230. In this state, the switching node 210 is coupled to ground to switch ON the pull-up transistor 204. With the gate of the coupling transistor 220 coupled to a LOW voltage level at the output of the inverter 150, the coupling transistor 220 eventually switches ON and couples the gate of the pull-up transistor 208 to the voltage supply, thereby switching OFF the pull-up transistor 208 and decoupling the output node 234 from the voltage supply. Concurrently, the discharge transistor 230 couples the output node 234 to ground to quickly pull the output node 234 from the V2 voltage level to a LOW voltage level as the pull-up transistor 208 is switched OFF.

It will be appreciated that in the voltage level shifting circuit 200, the pull-up transistors 204 and 208 are not switched OFF by the voltage of the output node 234, but rather, by the voltage at the switching nodes 210 and 206, respectively. In contrast, as previously mentioned, the voltage at the output node of a conventional voltage shifting circuit is used to switch OFF a pull-up transistor, as well as provide an output signal while the output node is pulled to ground. With embodiments of the present invention, the speed at which the pull-up transistors 204 and 208 can be switched OFF is decoupled to some extent from the speed at which the voltage at the output node 234 changes. While the discharging transistor 230 is coupling the output node 234 to ground, the switching node 206 is coupled to the voltage supply through the coupling transistor 220 and the pull-up transistor 204 to provide sufficient voltage to quickly switch OFF the pull-up transistor 208 and thus, allow the output node 234 to be pulled to ground through the discharging transistor 230 more quickly.

Additionally, having the output node separated from the nodes that switch the pull-up transistors 204, 208 ON and OFF further allow for dimensions of the various transistor to be scaled advantageously. For example, the dimensions of the pull-up transistors 204, 208 can be selected to provide sufficient current drive to the output node 234 rather than in consideration of the rate at which the output node 234 can be pulled to ground through the discharging transistor 230. Additionally, since the output node 234 is coupled to the voltage supply through the pull-up transistor 208, the coupling transistors 220, 224 can be relatively "small" because the output current is not driven through the coupling transistors 220, 224 to the output node 234. With the smaller dimensions, the coupling transistors 220, 224 can be switched ON quickly to couple the gate of the pull-up transistor 208 to the voltage supply, thereby using the relatively high voltage of the voltage supply to switch OFF the pull-up transistor 208 and increase the responsiveness of voltage changes at the output node 234.

Figure 3:
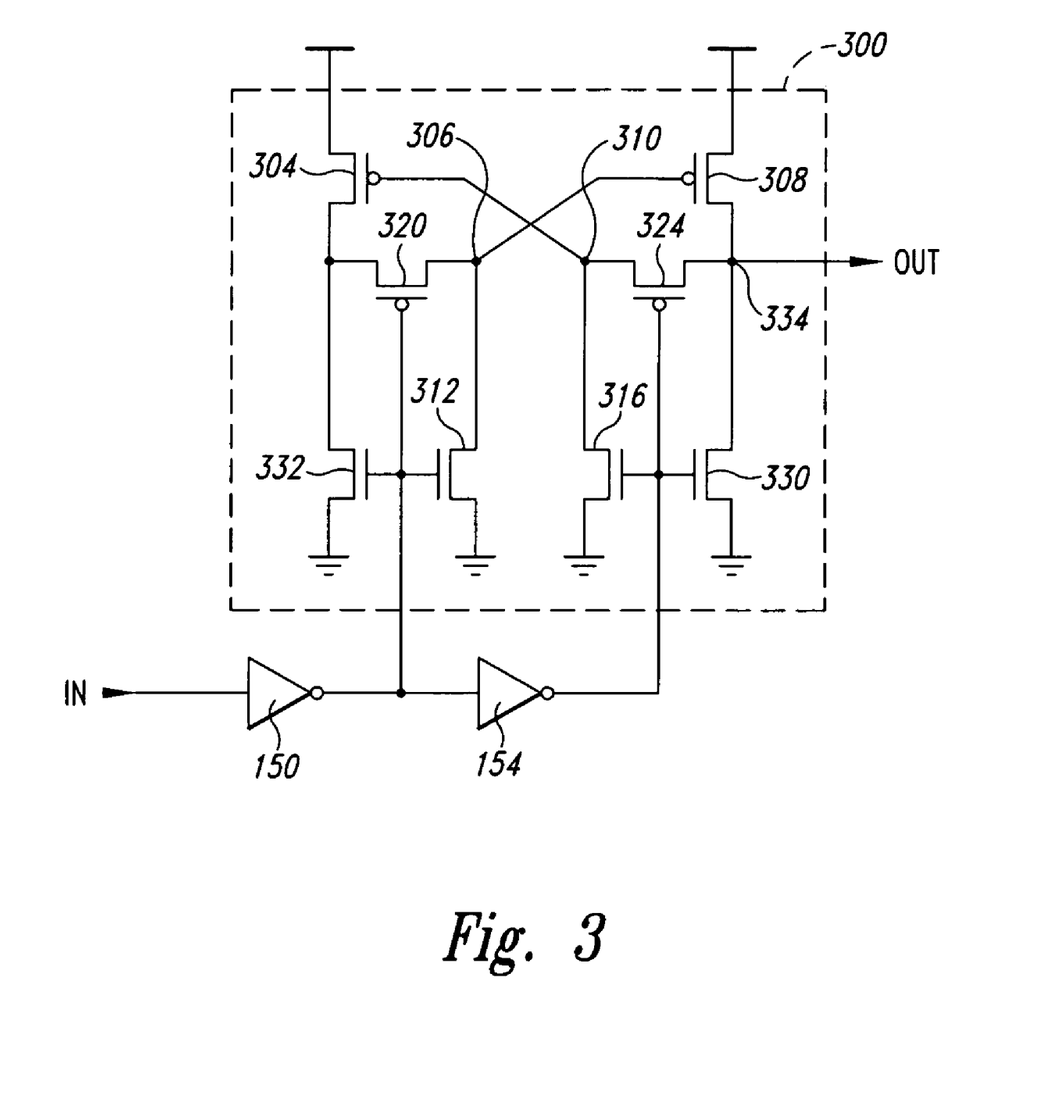
FIG. 3 is a schematic drawing of a voltage level shifting circuit according to another embodiment of the present invention.

FIG. 3 illustrates a voltage level shifting circuit 300 according to another embodiment of the present invention. The voltage level shifting circuit 300 is similar to the voltage level shifting circuit 200 of FIG. 2. However, the voltage level shifting circuit 300 further includes a second discharging transistor 332 coupled to a node 336, which can be used to provide an output signal complementary to the OUT signal provided at the output node 334. Operation of the voltage level shifting circuit 300 is also to that described above with respect to the voltage level shifting circuit 200. However, the second discharging transistor 332 is switched ON in addition to the switching transistor 312 in response to a rising edge signal output from the inverter 150 to quickly discharge the node 336.

Figure 4:
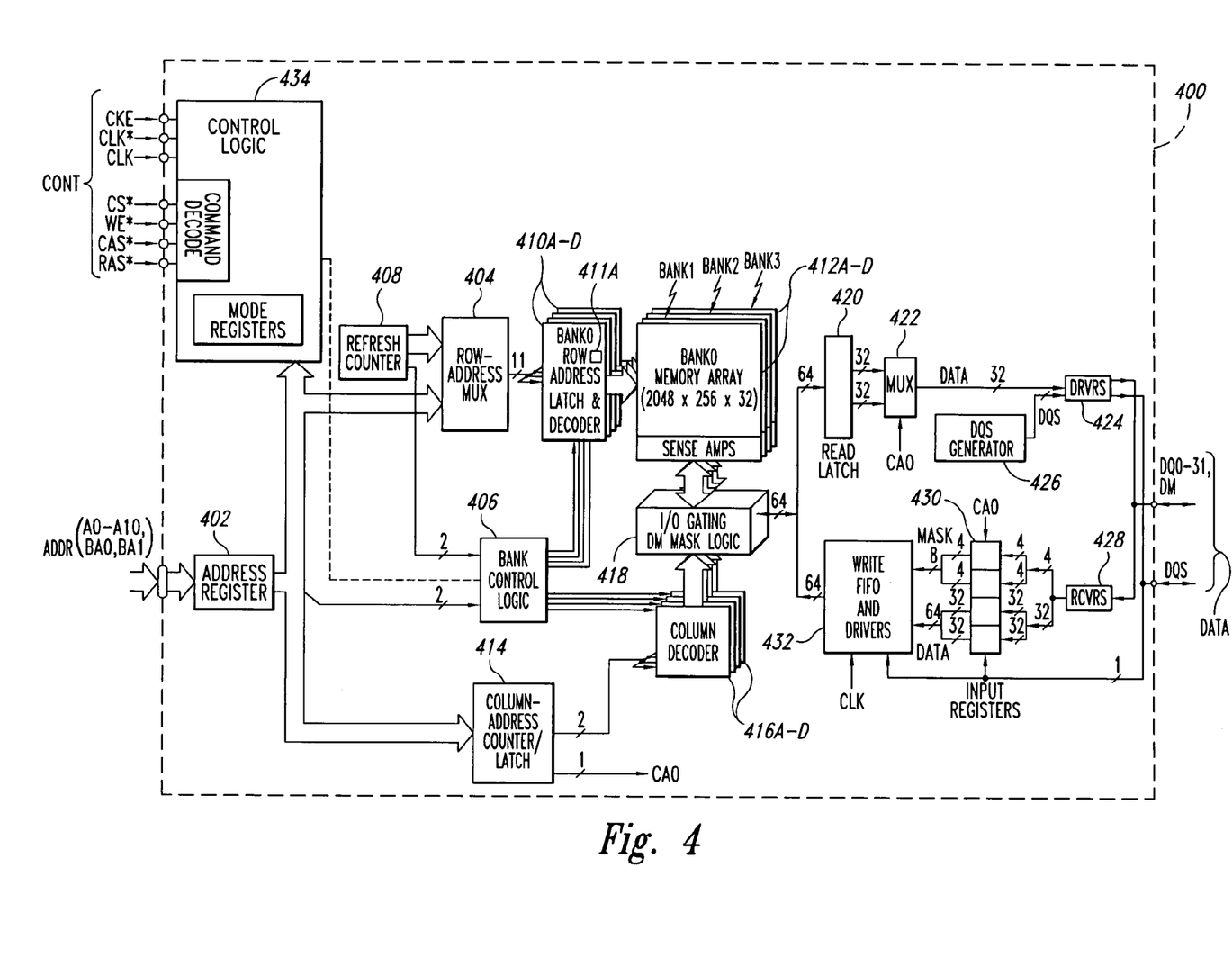
FIG. 4 is a partial functional block diagram illustrating a memory device including a voltage level shifting circuit according to an embodiment of the present invention.

FIG. 4 illustrates a memory device 400 including at least one voltage level shifting circuits according to an embodiment of the present invention. The memory device 400 includes an address register 402 that receives row, column, and bank addresses over an address bus ADDR, with a memory controller (not shown) typically supplying the addresses. The address register 402 receives a row address and a bank address that are applied to a row address multiplexer 404 and bank control logic circuit 406, respectively. The row address multiplexer 404 applies either the row address received from the address register 402 or a refresh row address from a refresh counter 408 to a plurality of row address latch and decoders 410A–D. The bank control logic 406 activates the row address latch and decoder 410A–D corresponding to either the bank address received from the address register 402 or a refresh bank address from the refresh counter 408, and the activated row address latch and decoder latches and decodes the received row address. Included in the row address latch and decoders 410A–D are respective voltage level shifting circuits 411A–D for shifting the voltage of signals having a first voltage level to an output signal having a higher second voltage level.

In response to the decoded row address, the activated row address latch and decoder 410A–D applies various signals to a corresponding memory bank 412A–D, including a row activation signal to activate a row of memory cells corresponding to the decoded row address. Each memory bank 412A–D includes a memory-cell array having a plurality of memory cells arranged in rows and columns. The row activation signal can have the second voltage level as provided by a respective voltage level shifting circuits 411A–D in order to drive the word line to a sufficiently high voltage level to activate access transistors of the memory cells. The data stored in the memory cells in the activated row are sensed and amplified by sense amplifiers in the corresponding memory bank. The row address multiplexer 404 applies the refresh row address from the refresh counter 408 to the decoders 410A–D and the bank control logic circuit 406 uses the refresh bank address from the refresh counter when the memory device 400 operates in an auto-refresh or self-refresh mode of operation in response to an auto- or self-refresh command being applied to the memory device 400, as will be appreciated by those skilled in the art.

A column address is applied on the ADDR bus after the row and bank addresses, and the address register 402 applies the column address to a column address counter and latch 414 which, in turn, latches the column address and applies the latched column address to a plurality of column decoders 416A–D. The bank control logic 406 activates the column decoder 416A–D corresponding to the received bank address, and the activated column decoder decodes the applied column address. Depending on the operating mode of the memory device 400, the column address counter and latch 414 either directly applies the latched column address to the decoders 416A–D, or applies a sequence of column addresses to the decoders starting at the column address provided by the address register 402. In response to the column address from the counter and latch 414, the activated column decoder 416A–D applies decode and control signals to an I/O gating and data masking circuit 418 which, in turn, accesses memory cells corresponding to the decoded column address in the activated row of memory cells in the memory bank 412A–D being accessed.

During data read operations, data being read from the addressed memory cells is coupled through the I/O gating and data masking circuit 418 to a read latch 420. The I/O gating and data masking circuit 418 supplies N bits of data to the read latch 420, which then applies two N/2 bit words to a multiplexer 422. In the embodiment of FIG. 3, the circuit 418 provides 64 bits to the read latch 420 which, in turn, provides two 32 bits words to the multiplexer 422. A data driver 424 sequentially receives the N/2 bit words from the multiplexer 422 and also receives a data strobe signal DQS from a strobe signal generator 426. The DQS signal is used by an external circuit such as a memory controller (not shown) in latching data from the memory device 400 during read operations. The data driver 424 sequentially outputs the received N/2 bits words as a corresponding data word DQ, each data word being output in synchronism with a rising or falling edge of a CLK signal that is applied to clock the memory device 400. The data driver 424 also outputs the data strobe signal DQS having rising and falling edges in synchronism with rising and falling edges of the CLK signal, respectively. Each data word DQ and the data strobe signal DQS collectively define a data bus DATA.

During data write operations, an external circuit such as a memory controller (not shown) applies N/2 bit data words DQ, the strobe signal DQS, and corresponding data masking signals DM on the data bus DATA. A data receiver 428 receives each DQ word and the associated DM signals, and applies these signals to input registers 430 that are clocked by the DQS signal. In response to a rising edge of the DQS signal, the input registers 430 latch a first N/2 bit DQ word and the associated DM signals, and in response to a falling edge of the DQS signal the input registers latch the second N/2 bit DQ word and associated DM signals. The input register 430 provides the two latched N/2 bit DQ words as an N-bit word to a write FIFO and driver 432, which clocks the applied DQ word and DM signals into the write FIFO and driver in response to the DQS signal. The DQ word is clocked out of the write FIFO and driver 432 in response to the CLK signal, and is applied to the I/O gating and masking circuit 418. The I/O gating and masking circuit 418 transfers the DQ word to the addressed memory cells in the accessed bank 412A–D subject to the DM signals, which may be used to selectively mask bits or groups of bits in the DQ words (i.e., in the write data) being written to the addressed memory cells.

A control logic and command decoder 434 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 434 latches and decodes an applied command, and generates a sequence of clocking and control signals that control the components 402–432 to execute the function of the applied command. The clock enable signal CKE enables clocking of the command decoder 434 by the clock signals CLK, CLK*. The command decoder 434 latches command and address signals at positive edges of the CLK, CLK* signals (i.e., the crossing point of CLK going high and CLK* going low), while the input registers 430 and data drivers 424 transfer data into and from, respectively, the memory device 400 in response the data strobe signal DQS. The detailed operation of the control logic and command decoder 434 in generating the control and timing signals is conventional, and thus, for the sake of brevity, will not be described in more detail. Although previously described with respect to a dynamic random access memory device, it will be appreciated by those ordinarily skilled in the art that embodiments of the present invention can be utilized in applications other than for a memory device where it is desirable to shift the voltage level of an input signal from a first voltage level to a second, higher voltage level.

Figure 5:
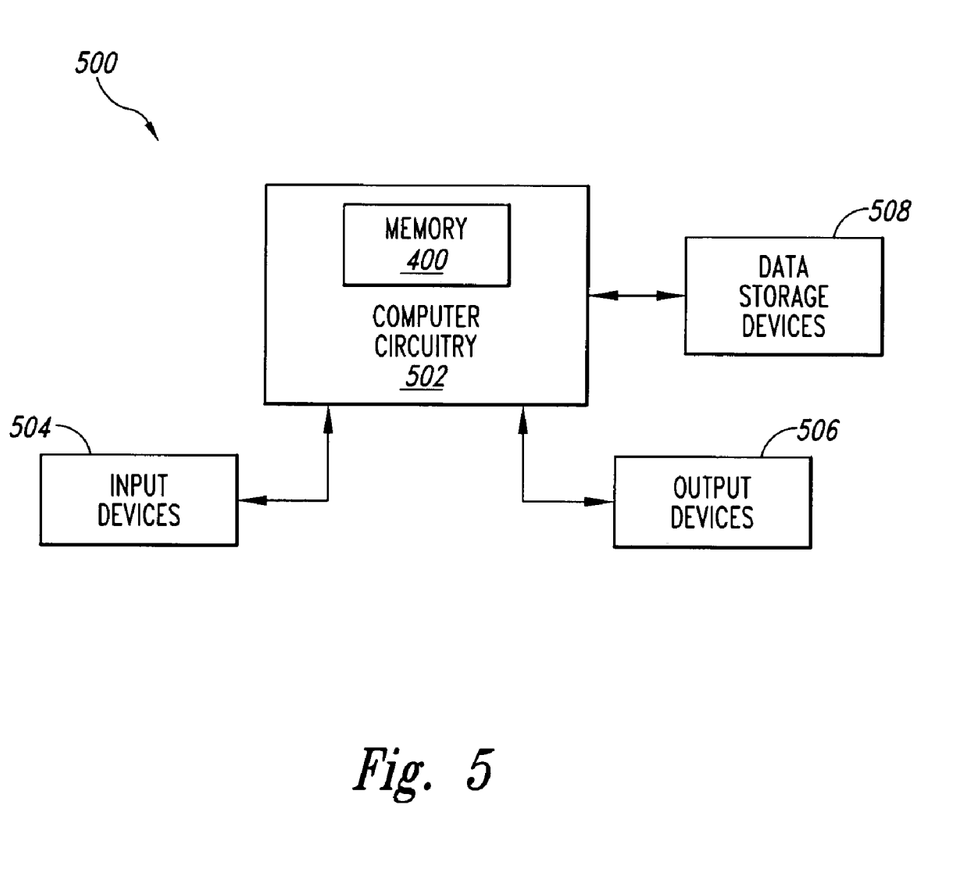
FIG. 5 is a partial functional block diagram illustrating a processor-based system including the memory device of FIG. 4.

FIG. 5 is a block diagram of a computer system 500 including computer circuitry 502 including the memory device 400 of FIG. 4. Typically, the computer circuitry 502 is coupled through address, data, and control buses to the memory device 400 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, embodiments of the present invention can be modified to shift the voltage level of an input signal having a negative voltage to a less negative voltage level or to ground. Such modifications are well within the skill of those ordinarily skilled in the art. Accordingly, the invention is not limited except as by the appended claims.

What is claimed is:

1. A voltage shifting circuit, comprising:
    a first current path from a voltage supply to ground, the first current path having a first input signal node to which an input signal is coupled and having a pull-up transistor coupled to the voltage supply and a first output signal node from which an output signal is provided, the pull-up transistor having a control node coupled to a first pull-up node, the first current path having a coupling transistor coupled to the first output signal node and a first switching node, the coupling transistor having a control node coupled to the first input signal node, the first current path further having a switching transistor coupled to the switching node and ground, the switching transistor having a control node coupled to the first input signal node, the first current path configured to couple the voltage supply to the first output signal node under control of the first pull-up node and couple the first switching node to ground in response to the input signal;
    a second current path from the voltage supply to ground, the second current path having a second input signal node to which a complementary input signal is coupled, a second output signal node from which a complementary output signal provided, a second pull-up node coupled to the first switching node, and a second switching node coupled to the first pull-up node, the second discharge path configured to couple the voltage supply to the second output signal node under control of the second pull-up node and couple the second switching node to ground in response to the complementary input signal; and
    a third current path from the output signal node to ground, the third path configured to couple the output signal node to ground in response to the input signal.

2. The voltage shifting circuit of claim 1 wherein the pull-up and coupling transistors comprise p-channel MOS (PMOS) transistors and the coupling transistor has channel dimensions that are smaller relative to channel dimensions of the pull-up transistor.

3. The voltage shifting circuit of claim 1 wherein the second current path comprises:
    a pull-up transistor coupled to the voltage supply and the second output signal node, the pull-up transistor having a control node to control the coupling the voltage supply to the second output signal node coupled that represents the second pull-up node;
    a coupling transistor coupled to the second output signal node and the second switching node, the coupling transistor having a control node to control the coupling of the second output signal node to the second switching node that is coupled to the second input signal node; and
    a switching transistor coupled to the switching node and ground, the switching transistor having a control node to control the coupling of the switching node to ground that is coupled to the second input signal node.

4. The voltage shifting circuit of claim 3 wherein the pull-up and coupling transistors comprise p-channel MOS (PMOS) transistors and the coupling transistor has channel dimensions that are smaller relative to channel dimensions of the pull-up transistor.

5. The voltage shifting circuit of claim 1, further comprising a fourth current path from the second output signal node to ground, the fourth path coupling the second output signal node to ground in response to the complementary input signal.

6. A voltage level shifting circuit, comprising:
    first and second output nodes at which an output signal and a complementary output signal are provided, respectively;
    first and second transistors, each having a source node coupled to a voltage supply and further having drain and gate nodes;
    third and fourth transistors, each having source, drain and gates nodes, the sources of the third and fourth transistors coupled to the drain nodes of the first and second transistors and the drain nodes of the third and fourth transistors coupled to the gate nodes of the second and first transistors, all respectively, the gate nodes of the third and fourth transistors coupled to receive an input signal and a complementary input signal, respectively;

fifth and sixth transistors, each having source, drain and gate nodes, the drain nodes of the fifth and sixth transistors coupled to the drain nodes of the third and fourth transistors and the gate nodes coupled to the gate nodes of the gate nodes of the third and fourth transistors, all respectively, the source nodes of the fifth and sixth transistors coupled to a ground; and seventh and eighth transistors, each having source, drain, and gate nodes, the drain nodes of the seventh and eighth transistors coupled to the drain nodes of the first and second transistors and the gate nodes of the seventh and eighth transistors coupled to the gate nodes of the third and fourth transistors, all respectively, the source nodes of the seventh and eighth transistors coupled to the ground.

7. The voltage level shifting circuit of claim 6 wherein the first and second transistors comprise p-channel MOS (PMOS) transistors and the fifth and sixth transistors comprise n-channel MOS (NMOS) transistors.

8. The voltage level shifting circuit of claim 7 wherein the third and fourth transistors comprise PMOS transistors.

9. The voltage level shifting circuit of claim 8 wherein the third and fourth PMOS transistors comprise PMOS transistors having channel dimensions that are smaller relative to channel dimensions of the first and second PMOS transistors.

10. A voltage level shifting circuit for providing an output signal having an output voltage level in response to an input signal having an input voltage level, the voltage level shifting circuit comprising:

first and second pull-up transistors, each pull-up transistor having first, second, and control terminals, the first and second terminal selectively coupled together under control of the control terminal, the first terminals of the pull-up transistors coupled a voltage supply providing the output voltage level, the output signal provided from the second terminal of the first pull-up transistor;

first and second coupling transistors, each coupling transistor having a first coupling terminal coupled to the second terminal of a respective pull-up transistor and having a second coupling terminal coupled to the control terminal of the other pull-up transistor, each coupling transistor further having a control terminal to control coupling of the first and second coupling terminals;

first and second switching transistors, each switching transistor having a first switching terminal coupled to the second coupling terminal of a respective coupling transistor and having a second switching terminal coupled to a ground, each switching transistor further having a control terminal to control the coupling of the first and second switching terminals, the input signal coupled to the control terminal of the first switching transistor and a complementary input signal coupled to the control terminal of the second switching transistor; and a discharging transistor having a first discharging terminal coupled to the second terminal of the first pull-up transistor and having a second discharging terminal coupled to the ground, the discharging transistor further having a control terminal coupled to the control terminal of the first coupling transistor to control the coupling of the first and second discharging terminals.

11. The voltage level shifting circuit of claim 10 wherein the discharging transistor comprises a first discharging transistor and the voltage level shifting circuit further comprises a second discharging transistor having a first terminal coupled to the second terminal of the second pull-up transistor and having a second terminal coupled to the ground, the second discharging transistor further having a control terminal coupled to the control terminal of the second coupling transistor.

12. The voltage level shifting circuit of claim 10 wherein the first and second pull-up transistors comprise p-channel MOS (PMOS) transistors, the first and second coupling transistors comprise PMOS transistors, the first and second switching transistors comprise n-channel MOS (NMOS) transistors, and the discharging transistor comprises a NMOS transistor.

13. The voltage level shifting circuit of claim 12 wherein the first and second PMOS coupling transistors comprise PMOS transistors having channel dimensions that are smaller relative to channel dimensions of the first and second PMOS pull-up transistors.

14. A memory device, comprising:

an address bus;

a control bus;

an address decoder coupled to the address bus;

a control circuit coupled to the control bus;

a memory-cell array coupled to the address decoder and control circuit a read/write circuit coupled to the memory-cell array; and a voltage level shifting circuit coupled to the address decoder and the memory cell array to provide a row activation signal having an activation voltage level in response to the address decoder selecting a row of memory for activation by providing a decode signal having a decode signal voltage level, the voltage level shifting circuit comprising:

a first current path from a voltage supply providing the activation voltage level to ground, the first path having a first input signal node to which an input signal having the decode signal voltage level is coupled, a first output signal node from which an output signal is provided, a first pull-up node, and a first switching node, the first discharge path coupling the voltage supply to the first output signal node under control of the first pull-up node and coupling the switching node to ground in response to the input signal;

a second current path from the voltage supply to ground, the second path having a second input signal node to which a complementary input signal having the decode signal voltage level is coupled, a second output signal node from which a complementary output signal is provided, a second pull-up node coupled to the first switching node, and a second switching node coupled to the first pull-up node, the second discharge path coupling the voltage supply to the second output signal node under control of the second pull-up node and coupling the second switching node to ground in response to the complementary input signal; and a third current path from the output signal node to ground, the third path coupling the output signal node to ground in response to the input signal.

15. The voltage shifting circuit of claim 14 wherein the first current path comprises:

a pull-up transistor coupled to the voltage supply and the first output signal node, the pull-up transistor having a control node to control the coupling the voltage supply to the first output signal node coupled that represents the first pull-up node;

a coupling transistor coupled to the first output signal node and the first switching node, the coupling transistor having a control node to control the coupling of the first output signal node to the first switching node that is coupled to the first input signal node; and a switching transistor coupled to the switching node and ground, the switching transistor having a control node to control the coupling of the switching node to ground that is coupled to the first input signal node.

16. The memory device of claim 15 wherein the pull-up and coupling transistors of the voltage shifting circuit comprise p-channel MOS (PMOS) transistors and the coupling transistor has channel dimensions that are smaller relative to channel dimensions of the pull-up transistor.

17. The memory device of claim 14 wherein the second current path of the voltage shifting circuit comprises:

a pull-up transistor coupled to the voltage supply and the second output signal node, the pull-up transistor having a control node to control the coupling the voltage supply to the second output signal node coupled that represents the second pull-up node;

a coupling transistor coupled to the second output signal node and the second switching node, the coupling transistor having a control node to control the coupling of the second output signal node to the second switching node that is coupled to the second input signal node; and a switching transistor coupled to the switching node and ground, the switching transistor having a control node to control the coupling of the switching node to ground that is coupled to the second input signal node.

18. The memory device of claim 17 wherein the pull-up and coupling transistors of the voltage shifting circuit comprise p-channel MOS (PMOS) transistors and the coupling transistor has channel dimensions that are smaller relative to channel dimensions of the pull-up transistor.

19. The memory device of claim 14 wherein the voltage shifting circuit further comprises a fourth current path from the second output signal node to ground, the fourth path coupling the second output signal node to ground in response to the complementary input signal.

20. A memory device, comprising:
an address bus;
a control bus;
an address decoder coupled to the address bus;
a control circuit coupled to the control bus;
a memory-cell array coupled to the address decoder and control circuit
a read/write circuit coupled to the memory-cell array; and
a voltage level shifting circuit coupled to the memory-cell array, comprising:
first and second output nodes at which an output signal and a complementary output signal are provided, respectively;
first and second transistors, each having a source node coupled to a voltage supply and further having drain and gate nodes;
third and fourth transistors, each having source, drain and gates nodes, the sources of the third and fourth transistors coupled to the drain nodes of the first and second transistors and the drain nodes of the third and fourth transistors coupled to the gate nodes of the second and first transistors, all respectively, the gate nodes of the third and fourth transistors coupled to receive an input signal and a complementary input signal, respectively;
fifth and sixth transistors, each having source, drain and gate nodes, the drain nodes of the fifth and sixth transistors coupled to the drain nodes of the third and fourth transistors and the gate nodes coupled to the gate nodes of the gate nodes of the third and fourth transistors, all respectively, the source nodes of the fifth and sixth transistors coupled to a ground; and
seventh and eighth transistors, each having source, drain, and gate nodes, the drain nodes of the seventh and eighth transistors coupled to the drain nodes of the first and second transistors and the gate nodes of the seventh and eighth transistors coupled to the gate nodes of the third and fourth transistors, all respectively, the source nodes of the seventh and eighth transistors coupled to the ground.

21. The memory device of claim 20 wherein the first and second transistors of the voltage level shifting circuit comprise p-channel MOS (PMOS) transistors and the fifth and sixth transistors comprise n-channel MOS (NMOS) transistors.

22. The memory device of claim 21 wherein the third and fourth transistors of the voltage level shifting circuit comprise PMOS transistors.

23. The memory device of claim 22 wherein the third and fourth PMOS transistors of the voltage level shifting circuit comprise PMOS transistors having channel dimensions that are smaller relative to channel dimensions of the first and second PMOS transistors.

24. A processor-based system, comprising:
a data input device;
a data output device;
a processor coupled to the data input and output devices; and
a memory device coupled to the processor, the memory device comprising:
an address bus;
a control bus;
an address decoder coupled to the address bus;
a control circuit coupled to the control bus;
a memory-cell array coupled to the address decoder and control circuit
a read/write circuit coupled to the memory-cell array; and
a voltage level shifting circuit coupled to the address decoder and the memory cell array to provide a row activation signal having an activation voltage level in response to the address decoder selecting a row of memory for activation by providing a decode signal having a decode signal voltage level, the voltage level shifting circuit comprising:
a first current path from a voltage supply providing the activation voltage level to ground, the first path having a first input signal node to which an input signal having the decode signal voltage level is coupled, a first output signal node from which an output signal is provided, a first pull-up node, and a first switching node, the first discharge path coupling the voltage supply to the first output signal node under control of the first pull-up node and coupling the switching node to ground in response to the input signal;
a second current path from the voltage supply to ground, the second path having a second input signal node to which a complementary input signal having the decode signal voltage level is coupled, a second output signal node from which a complementary output signal is provided, a second pull-up node coupled to the first switching node, and a second switching node coupled to the first pull-up node, the second discharge path coupling the voltage supply to the second output signal node under control of the second pull-up node and coupling the second switching node to ground in response to the complementary input signal; and a third current path from the output signal node to ground, the third path coupling the output signal node to ground in response to the input signal.

25. The processor-based system of claim 24 wherein the first and second current paths of the voltage shifting circuit comprise:

a pull-up transistor coupled to the voltage supply and the output signal node, the pull-up transistor having a control node to control the coupling the voltage supply to the output signal node coupled that represents the pull-up node, all respectively;

a coupling transistor coupled to the output signal node and the switching node, the coupling transistor having a control node to control the coupling of the output signal node to the switching node that is coupled to the input signal node, all respectively; and a switching transistor coupled to the switching node and ground, the switching transistor having a control node to control the coupling of the switching node to ground that is coupled to the input signal node, all respectively.

26. The processor-based system of claim 25 wherein the pull-up and coupling transistors of the voltage shifting circuit comprise p-channel MOS (PMOS) transistors and the coupling transistor has channel dimensions that are smaller relative to channel dimensions of the pull-up transistor.

27. The processor-based system of claim 24 wherein the voltage shifting circuit further comprises a fourth current path from the second output signal node to ground, the fourth path coupling the second output signal node to ground in response to the complementary input signal.

28. A processor-based system, comprising:
a data input device;
a data output device;
a processor coupled to the data input and output devices; and
a memory device coupled to the processor, the memory device comprising:
an address bus;
a control bus;
an address decoder coupled to the address bus;
a control circuit coupled to the control bus;
a memory-cell array coupled to the address decoder and control circuit
a read/write circuit coupled to the memory-cell array; and
a voltage level shifting circuit coupled to the memory-cell array, comprising:
first and second output nodes at which an output signal and a complementary output signal are provided, respectively;
first and second transistors, each having a source node coupled to a voltage supply and further having drain and gate nodes;
third and fourth transistors, each having source, drain and gates nodes, the sources of the third and fourth transistors coupled to the drain nodes of the first and second transistors and the drain nodes of the third and fourth transistors coupled to the gate nodes of the second and first transistors, all respectively, the gate nodes of the third and fourth transistors coupled to receive an input signal and a complementary input signal, respectively;
fifth and sixth transistors, each having source, drain and gate nodes, the drain nodes of the fifth and sixth transistors coupled to the drain nodes of the third and fourth transistors and the gate nodes coupled to the gate nodes of the gate nodes of the third and fourth transistors, all respectively, the source nodes of the fifth and sixth transistors coupled to a ground; and
seventh and eighth transistors, each having source, drain, and gate nodes, the drain nodes of the seventh and eighth transistors coupled to the drain nodes of the first and second transistors and the gate nodes of the seventh and eighth transistors coupled to the gate nodes of the third and fourth transistors, all respectively, the source nodes of the seventh and eighth transistors coupled to the ground.

29. The processor-based system of claim 28 wherein the first and second transistors of the voltage level shifting circuit comprise p-channel MOS (PMOS) transistors and the fifth and sixth transistors comprise n-channel MOS (NMOS) transistors.

30. The processor-based system of claim 29 wherein the third and fourth transistors of the voltage level shifting circuit comprise PMOS transistors.

31. The processor-based system of claim 30 wherein the third and fourth PMOS transistors of the voltage level shifting circuit comprise PMOS transistors having channel dimensions that are smaller relative to channel dimensions of the first and second PMOS transistors.

* * * * *